United States Patent [19]

Katagiri et al.

[11] Patent Number: 5,619,111

[45] Date of Patent: Apr. 8, 1997

[54] MOTOR CONTROL SYSTEM FOR CONTROLLING THE OPERATIONS OF A PLURALITY OF SERVO MOTORS

[75] Inventors: Takashi Katagiri; Tetsuo Momose, both of Nagano, Japan

[73] Assignee: Kabushiki Kaisha Sankyo Seiki Seisakusho, Nagano, Japan

[21] Appl. No.: 587,712

[22] Filed: Jan. 19, 1996

[30] Foreign Application Priority Data

Jan. 20, 1995 [JP] Japan .................................. 7-026228

[51] Int. Cl.$^6$ .............................. G05B 11/32; H05K 7/02
[52] U.S. Cl. ......................... 318/625; 318/51; 318/105; 361/760; 361/736; 361/703
[58] Field of Search ........................... 318/625, 51, 105, 318/106, 107, 538; 361/600, 601, 644, 679, 688, 703, 724, 728, 729, 730, 733, 736, 748, 752, 760, 785

[56] References Cited

FOREIGN PATENT DOCUMENTS 4-90011  3/1992  Japan ............................. G05D 3/12

*Primary Examiner*—John W. Cabeca
*Attorney, Agent, or Firm*—Sughrue, Mion, Zinn, Macpeak & Seas

[57] ABSTRACT

Functional element units are fixedly mounted on a circuit board, and unit-side connectors are electrically wired to base-board-side connectors. A predetermined wiring circuit has been formed on the circuit board, with the result that the wiring work is simplified as much, and the disused connectors can be disposed of, so that the number of connectors is reduced. In addition, the electrical connection of the functional element units through those connectors, provides the following effects: the wiring is orderly and reasonable, the number of wires is small, the occurrence of wiring errors is prevented, and in addition the application of external noises to the wires is prevented. That is, the operation of the motor control system high in reliability.

11 Claims, 11 Drawing Sheets

51, 55: DEAD TIME FORMING SECTION
53: A/D CONVERTER
57: MICROCOMPUTER
52, 56: INVERTER
54: CURRENT DETECTOR
58: ABNORMAL CONDITION DETECTING SECTION

60: POSITION CONTROL SECTION 61: SPEED CONTROL SECTION
62: CURRENT CONTROL SECTION 63: PWM SIGNAL GENERATING SECTION
64, 65, 66, 67, 68, 69: SERIAL/PARALLEL CONVERSION SECTION

|  | CONVENTIONAL | PRESENT INVENTION |
|---|---|---|
| STRUCTURE | 6 A/D CONVERTERS OF TWO-CHANNEL INPUT AND PARALLEL OUTPUT | 3 A/D CONVERTERS OF FOUR-CHANNEL INPUT AND SERIAL OUTPUT |
| PIN NUMBER OF INVERTER SIGNAL CONNECTORS (34, 35, 36) | 14 | 4 |
| PIN NUMBER OF CONTROL INVERTER I/F CONNECTOR (37) | 19 | 6 |

MOTOR CONTROL SYSTEM FOR CONTROLLING THE OPERATIONS OF A PLURALITY OF SERVO MOTORS

BACKGROUND OF THE INVENTION

1. Field of the Invention

This invention relates to a motor control system which is adapted to control the operations of a plurality of servomotors.

2. Related Art

Numerical control systems or positioning systems for controlling industrial robots, machine tools, automated devices, and so forth, employ AC servomotors to position the rotary shafts. The servo-motor is controlled by a motor control device using a servo control system.

FIG. 12 shows an external arrangement of a conventional motor control system for controlling a plurality of servomotors. The motor control system shown in FIG. 12 is for six servomotors. Control units U1 through U6 are provided for the six servomotors, respectively. Those control units U1 through U6 are juxtaposed together with a higher control unit Uh which is adapted to transmit control instructions from an external controller. The control units U1 through U6 and the higher control unit Uh are accommodated in their own casings, respectively, and have a number of electrical wiring connectors and so forth on the front walls.

Those connectors are roughly classified into three kinds of connectors—power wiring connectors, signal line connectors, and motor driving connectors. Each of the control units (for instance the control unit U6) has a serial communication connector 204, a control signal connector 205, an encoder connector 206, a motor drive line connector 207, and a power connector 211. Hence, it is necessary to connect a common power source 200 through wires to the power connectors 211 of all the control units U1 through U6, and to connect servomotors M1 through M6 through wires to motor drive line connectors 207, and to connect encoders E1 through E6 through wires to the encoder connectors 206. In addition, in order to transmit control signals, it is necessary to extend jumper wires from the higher control unit Uh to the control signal connectors 205 of the control units U1 through U6. Furthermore, in each of the control units U1 through U6, wiring must be made for other controls.

FIG. 13 shows a typical example of the control units, namely, the control unit U1. In FIG. 13, a rotational position target value Pref of the servomotor M1 is applied through the control signal connector 205 to a position control section 260. In the position control section 260, the rotational position target value Pref is compared with a position detection value which is obtained from an encoder signal e1 fed back from the encoder E1, and the difference between them is applied, as a speed instruction s, to a speed control section 261. In the speed control section 261, the speed instruction s is compared with the speed detection value obtained from the encoder signal e1, and the difference between them is applied, as e current instruction i, to a current control section 262. The current control section 262 forms a three-phase instruction v according to a magnetic pole position signal of the servo motor M1 obtained from the encoder signal e1, the current instruction i, and a current detection value Idet back from a current detector 258 and an A/D converter 253, and applies it to a PWM signal generating section 263. The PWM signal generating section 263 forms a PWM signal according to the three-phase instruction, and applies it through a dead time forming section 251 to an inverter 252. The latter 252 generates a motor drive voltage according to the PWM signal, to drive the servomotor M1.

The above-described current detector 258 forms a feedback loop to monitor the drive current of the inverter 252 for feedback control, and its output signal is applied to the AD converter 253, where it is subjected to A/D (analog-to-digital) conversion.

A conventional servo control system of this type has been disclosed, for instance, by Unexamined Japanese Patent Publication No. 90011/1992.

As is apparent from the above description, the conventional motor control system for controlling a plurality of servomotors needs a number of wiring cables and accordingly a number of components relevant thereto. Therefore, the system suffers from problems that it is high in component cost, and complicated in wiring, and accordingly high in assembling cost. In addition, the intricate wiring may result in the occurrence of wiring errors, which may lower the work efficiency in the assembling of the system.

If any one of the control units U1 through U6 becomes out of order, the repair is troublesome: First, from each of the control units, the connectors 205, 206, 207 and 211 are removed, and then the control unit is replaced with a new one. Thereafter, the wires must be connected to the connectors 205, 206, 207 and 211 again. This work is considerably laborious.

SUMMARY OF THE INVENTION

In view of the foregoing, an object of the invention is to provide a motor control system for controlling a plurality of servomotors which is small in the number of connectors, and simple in wiring, and in which, when a motor drive control unit becomes out of order, its wiring can be achieved with high efficiency, and its control operation is high in reliability.

According to an aspect of the present invention, there is provided a motor control system comprising: main circuit power source means for converting AC power supplied from a power source into DC power; motor drive means for converting said DC power into AC power, and supplying said AC power thus converted to a plurality of servomotors; control means for controlling the operation of said motor drive means, said main circuit power means, said motor drive means, and said control means are separated from one another, and accommodated, as units, in respective casings, thus providing functional element units having electrically wiring unit-side connectors; and a circuit board provided on which a predetermined wiring circuit has been formed, and having electrical wiring base-board-side connectors which are connected to said unit-side connectors, wherein when said functional element units are fixedly mounted on said circuit board as required, said unit-side connectors are engaged with said base-board-side connectors, so that said means are electrically connected to one another through said circuit board.

As was described above, in the motor control system of the invention, the predetermined wiring circuit has been formed on the circuit board. Hence, when the functional element units are fixedly mounted on the circuit board, the unit-side connectors are engaged with the base-board-side connectors, so that the functional element units are electrically connected to one another, with the result that the wiring work can be achieved with ease, and the disused connectors can be disposed of; that is, the number of connectors used therein is reduced as much. In addition, the functional element units are electrically connected through those connectors as was described above. This feature provides the following effects: the wiring is reasonable and orderly, the number of wires is reduced, the occurrence of wiring errors is prevented, and in addition the application of external noises to the wires is prevented. That is, the operation of the motor control system of the invention is high in reliability.

BRIEF DESCRIPTION OF THE DRAWING(S)

DETAILED DESCRIPTION OF THE PREFERRED EMBODIMENTS

One preferred embodiment of the invention will be described with reference to the accompanying drawings.

(I) FUNDAMENTAL STRUCTURE OF THE MOTOR CONTROL SYSTEM

Figure 1:
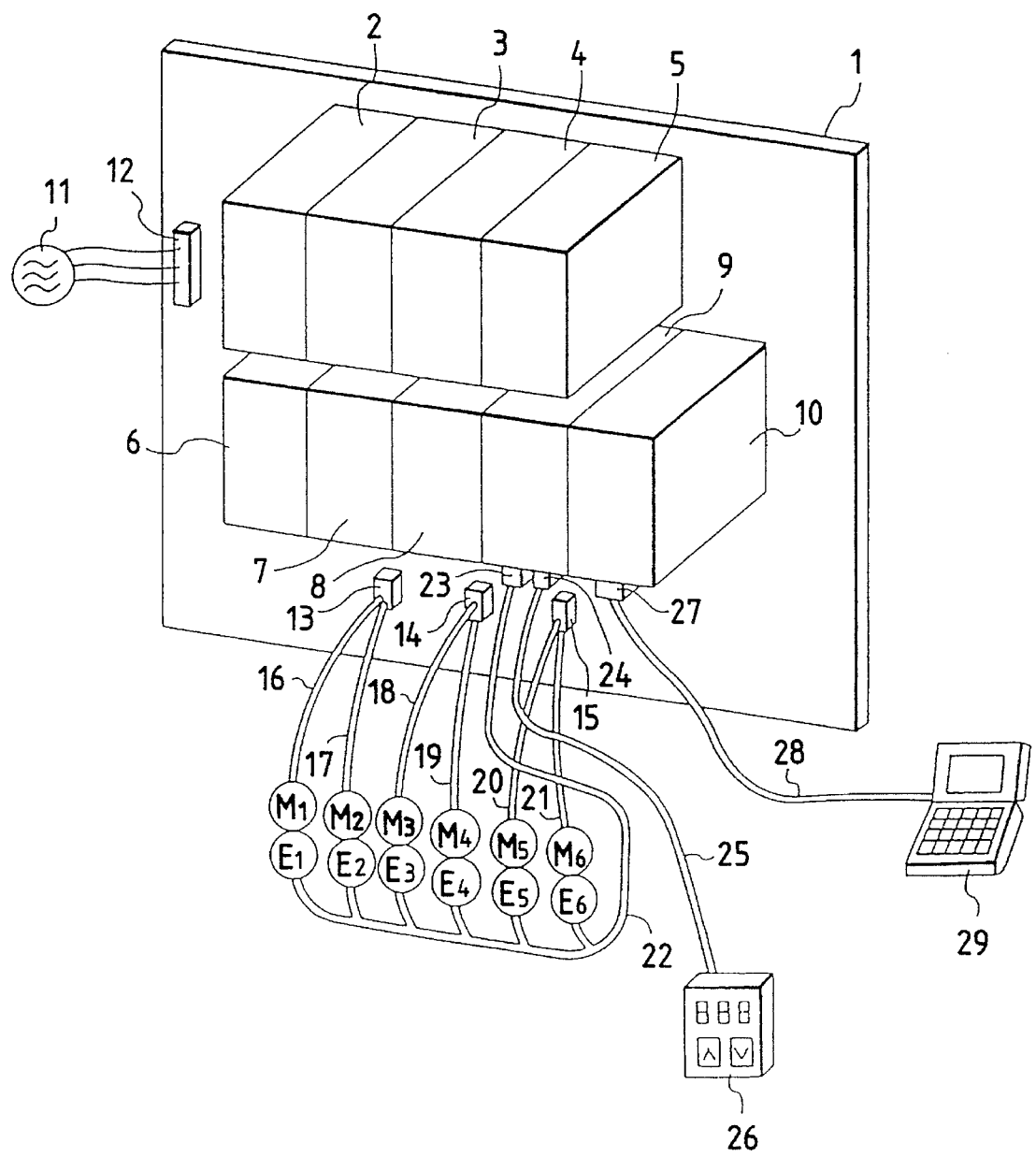
FIG. 1 is an external perspective view outlining the arrangement of various units forming a motor control system according to the invention.

FIG. 1 shows a fundamental arrangement of a motor control system according to the invention.

As shown in FIG. 1, a back plain plate 1 is held vertical which includes a circuit board which is formed using a glass epoxy resin plate. On the front surface of the back plain board 1, means 2, 3, 4 and 5, and means 6, 7, 8, 9 and 10 are fixedly mounted in two lines. Those means 1 through 10 are functional element units which are different in function (or operation) from one another.

That is, the functional element units arranged in the upper line are main circuit power means for converting AC power into DC power, namely, a main circuit power unit 2, additional capacitor units 3 and 4, and a small signal power unit 5. What are arranged in the lower line are: biaxial inverter units 6, 7 and 8 which are motor drive means which converts the DC power provided by the aforementioned main circuit power source into AC power again, and supplies the AC power to a plurality of servomotors (for instance two servomotors); a lower control unit 9 and a higher control unit 10 as control means. On the rear surface of the back plain board 1, a printed circuit board is formed in which circuit patterns have been printed which are necessary for motor control according to the invention. The back plain board 1 is used to fixedly mount the above-described functional element units (means) 2 through 10, and serves as a circuit board to connect those units 2 through 10 to one another.

On the front surface of the back plain board 1, a power connector 12 is provided near the arrays of the functional element units 2 to 10, and it is connected to a power cable from the commercial power source 11. Motor power line connectors 13, 14 and 15 are provided below the array of the functional element units 6 through 10, and are connected through motor wires 16 through 21 to servomotors M1 through M6. An encoder connector 23, and a serial communication connector 24 are mounted on the bottom of the lower control unit 9. The encoder connector 23 is connected to ends of an encoder lines 22 provided for the six encoders. The serial communication connector 24 is connected through a communication line 15 to an external setting device 26 such as a control parameter setting unit. The mounting of the encoder connector 23 and the serial communication connector 24 on the lower control unit 9 instead of the back plain board 1 provides the following merit: That is, the number of wires between the connecting connectors 37 and 41 and the back plain board 1 (as described later).

Similarly, a serial communication connector 27 is mounted on the bottom of the upper control unit 10. The connector 27 is connected through a communication line 28 to an externally set device such as a personal computer or teaching pendant.

Figure 2:
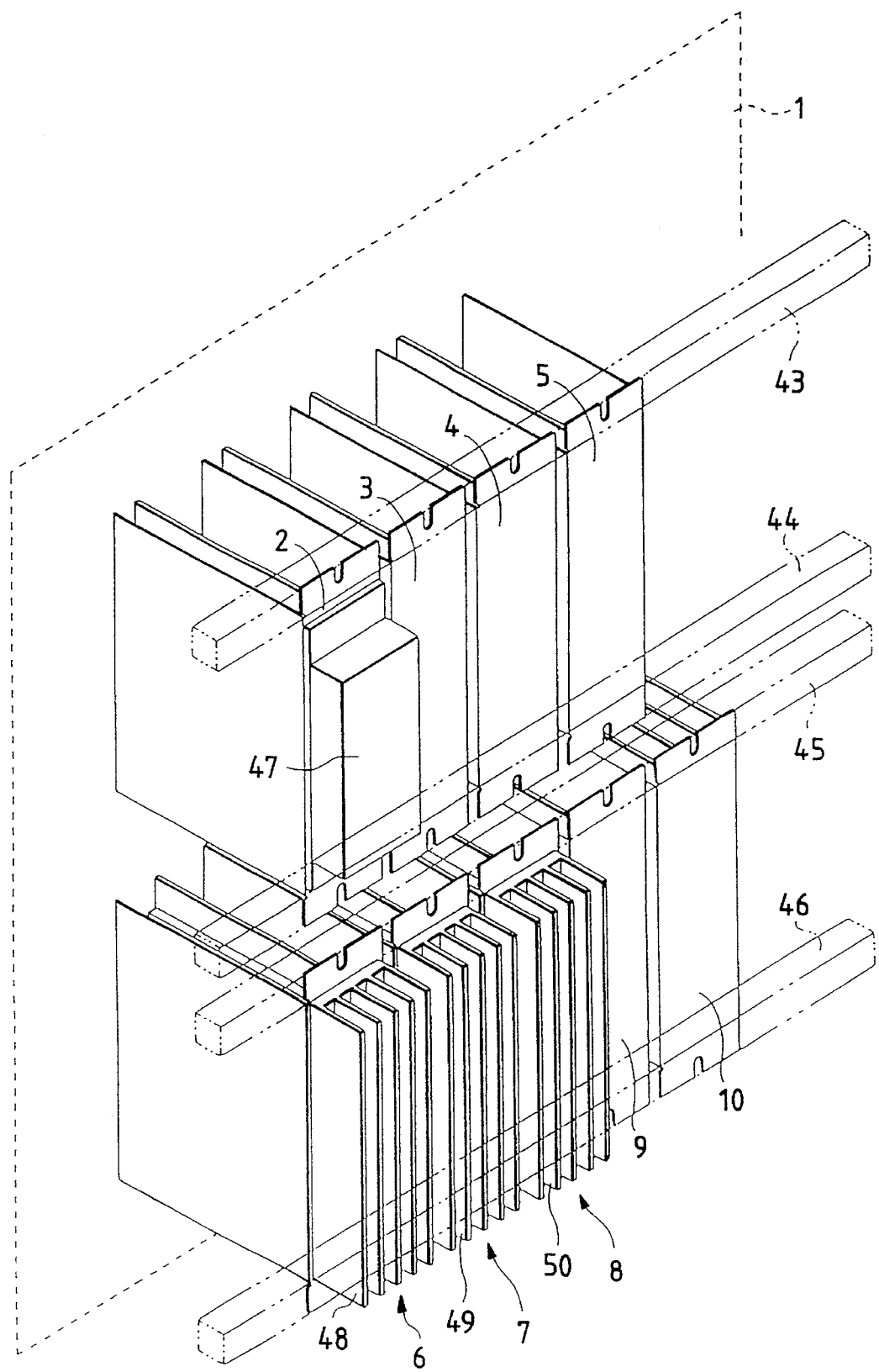
FIG. 2 is an external perspective view showing the structures of those units in detail.

FIG. 2 shows the construction of the above-described functional element units. As shown in FIG. 2, a pair of upper and lower supporting frames 43 and 44 are provided on the front surface of the back plain board 1 in such a manner that they are spaced away from the back plain board 1 in correspondence to the depth of the functional element units 2 through 5 and are spaced from each other in correspondence to the vertical length of them. Similarly, another pair of upper and lower supporting frames 445 and 46 are provided on the front surface of the back plain board 1 in such a manner that they are spaced away from the back plain board 1 in correspondence to the depth of the functional element units 6 through 10 and are spaced from each other in correspondence to the vertical length of them. That is, between the upper supporting frames 43 and 44, the main circuit power unit 2, the additional capacitor units 3 and 4, and the small signal power unit 5 are detachably mounted for convenience in maintenance. Similarly, between the lower supporting frames 45 and 46, the biaxial inverter units 6, 7 and 8, the lower control unit 9, and the higher control unit 10 are detachably mounted.

A regenerative resistor 47 is mounted on the front surface of the main circuit power unit 2. The regenerative resistor 47 is to consume and absorb the regenerative power which is generated in a servomotor when a deceleration instruction is applied to the servomotor. The reason why the regenerative resistor 47 is mounted on the front side of the main circuit power unit 2 which is opposite to the back plain board 1 (in the unit mounting direction) is that, since the regenerative resistor 47 is a heat generating source during operation, it is necessary to protect the internal circuit from being thermally affected by the internal regenerative resistor 47.

On the front surfaces of the biaxial inverter units 6, 7 and 8, cooling fin assemblies 48, 49 and 50 are provided in such a manner that they are protruded from those units 6, 7, and 8, respectively. The cooling fin assemblies 48, 49 and 50 are used to radiate heat from power devices such as power transistors in inserters 52 and 56 (described later) provided in the biaxial inverter units 6, 7 and 8. In order to improve the heat radiating efficiency of the fin assemblies 48, 49 and 50, it is desirable that their fins (blades) are extended vertically.

As was described above, the cooling fins 48, 49 and 50 are provided protruded from the casings of the respective biaxial inverter units 6, 7 and 8. Hence, heat will never be held inside the casings. This feature prevents the internal circuits from being thermally affected, eliminating factors such as temperature drift which make the circuits unstable during operation.

As was described above, the cooling fin assemblies 48, 49 and 50 of the biaxial inverter units 6, 7 and 8, the main circuit power unit 2, and the regenerative resistor 47 are arranged before as viewed in the direction of insertion of the units; that is, they are provided on the side which is opposite to the side where the electrically wiring (connecting) base-board-side connectors are provided. This is owing to the fact that, on the front side, the cables are eliminated, and the circuit wiring is performed on the back plain board 1 on the rear side.

Figure 3:
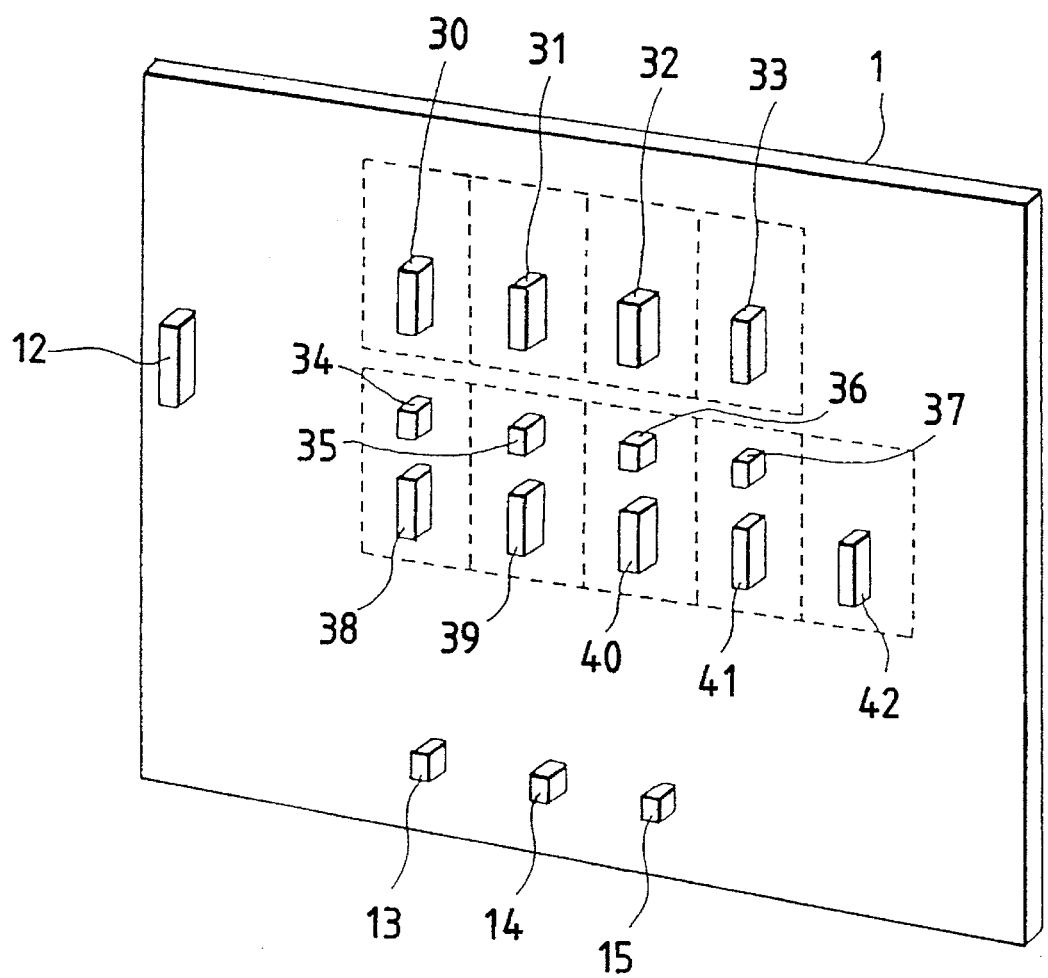
FIG. 3 is an external perspective view showing a variety of connectors mounted on a back plain board in the motor control system of the invention.

FIG. 3 shows connectors mounted on the back plain board 1. As shown in FIG. 3, on the rear surface of the back plain board 1, base-board-side connectors 30 through 42 are provided which are in correspondence to the positions of the units 2 through 10 and are threadably engageable with unit-side connectors (not shown) provided on the rears of those units 2 through 10. The units 2 through 10 are fixedly mounted on the back plain board 1 as follows: The units 2 through 10 are inserted into the back plain board 1 from front, and engaged with the upper supporting frames 43 and 44, and the lower supporting frames 45 and 46 with screws. Thus, the unit-side connectors of the units 2 through 10 are engaged with the base-board-side connectors 30 through 42, respectively. Predetermined printed circuit layers have been formed on the back plain board 1. Therefore, the units 2 through 10 are connected to one another through the printed circuits thus formed, so that the aimed motor control system according to the invention is formed.

(II) ARRANGEMENT AND CONNECTION OF THE FUNCTIONAL ELEMENT UNITS

Figure 4:
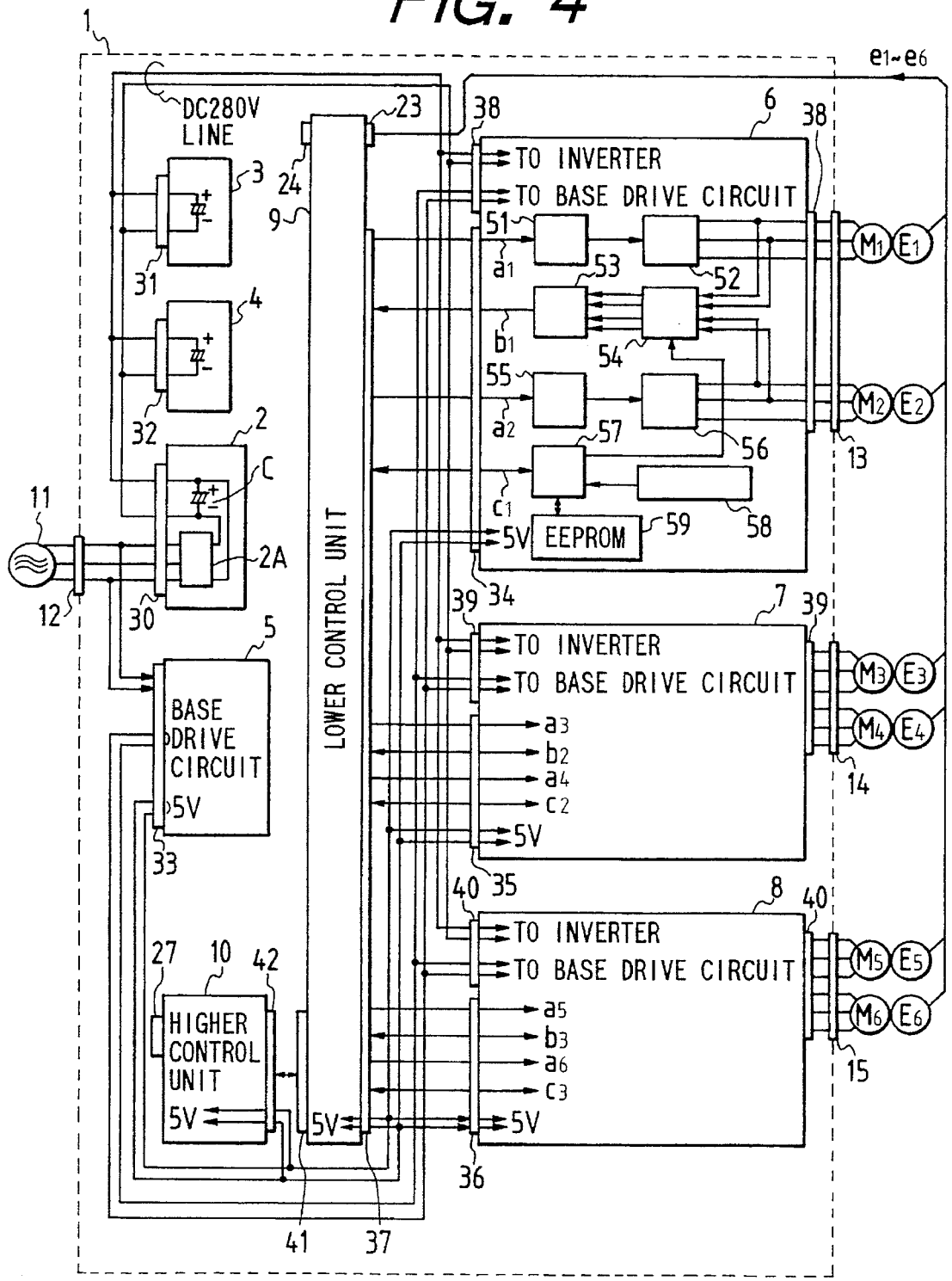
FIG. 4 is a block diagram for a description of the arrangement and connection of the units in the motor control system of the invention.

FIG. 4 shows the arrangements of the functional element units, and the connection of those units. The positions of the functional element units 2 through 10 on the back plain board 1 are not correspondent to those in FIG. 1; that is, FIG. 4 merely shows the electrical connection of them.

As shown in FIG. 4, the functional element units 1 through 10 are electrically connected to one another through base-board-side connectors 30 through 42. For this purposes, the wiring circuit layers printed on the back plain board are utilized.

Now, each of the functional element units will be described in detail. The motor control system can be roughly divided into two system circuits; namely, a large power system circuit, and a small signal system circuit.

First, the large power system circuit will be described. Three-phase AC power (for instance, of AC 200 V) from the commercial power source 11 is applied to the main circuit power unit 2 through the power connector 12.

The unit 2 includes a converter 2A for converting three-phase AC power into DC power, and a capacitor C for removing ripple components from the rectified output; i.e., for smoothing the latter. The converter 2A is, for instance, made up of a diode-connected three-phase bridge rectifier circuit, a regenerative resistor for consuming regenerated power, and a switching (on-off) circuit for the regenerative resistor. The obtained DC power (for instance DC 280 V) is applied, as high voltage, through the additional capacitor units 3 and 4 and the inverter large current connectors 38, 39 and 40 to the biaxial inverter units 6, 7 and 8.

The additional capacitor units 3 and 4 are so designed that, in the case where the smoothing capacitor becomes inadequate in capacitance when the drive capacity for the motor oontrol system of the invention is changed in specification, they supplement the capacitance without delay.

The DC power applied to the biaxial inverter units 6, 7 and 8 is applied to inserters 52 and 56 (which are provided in each of the units 5, 7 and 8), to drive the servomotors M1 through M6. (The arrangements of the inserters 52 and 56 will be described later.)

The small signal power unit 5 is a low voltage source. It includes a 5 V power source for the base drive circuits of power transistors forming the aforementioned inserters 52 and 56, and for small signal system units (described later). More specifically, it is made up of a constant voltage power unit such as a switching regulator.

An external control signal from the external setting device 29, which is a circuit of the small signal system, is applied through the serial communication connector 27 to the higher control unit 10. The latter 10 is to transmit the external control signal to the lower control unit 9; that is, it is a control unit higher in operating order than the lower control unit 9.

(III) LOWER CONTROL UNIT (SIX-AXES CONTROL UNIT)

The lower control unit 9 operates as follows8 That is, it operates in response to an external control signal from the upper control unit 10, a control parameter setting signal applied thereto through the communication line 28 (cf. FIG. 1) and the serial communication connector 24, encoder signals el through e6 from the encoders E1 through E6 which are fed back through the encoder connector 23, PWM signals al through a6, current serial signals bl through b6, or other internal correcting signals, and according to a control program stored in an EEPROM 107, thereby to perform feedback control of the biaxial inverter units 6, 7 and 8; that is, servo-control of the latter as a whole. That is, the servo motors M1 through M6 (six axes) are all controlled by the lower control unit 9; i.e., by the servo-controlling unit.

Figure 5:
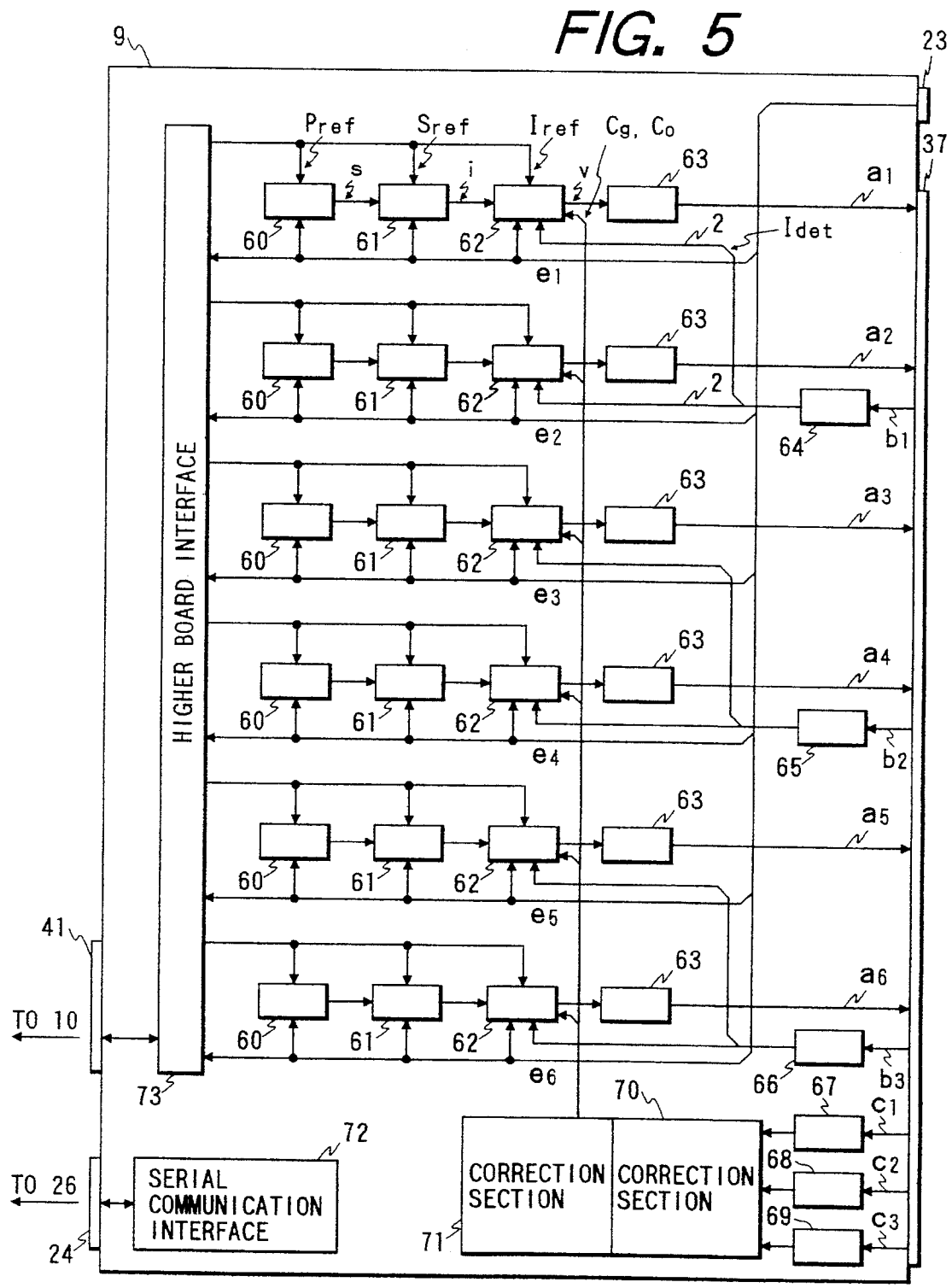
FIG. 5 is a block diagram showing an example of the arrangement of a lower control unit.

FIG. 5 is a diagram showing the functional sections of the lower control unit 9 in detail. The lower control unit 9 has six (6) control loops for the servomotors M1 through M6; however, for simplification in description, a typical one (for the first axis) will be described.

One (each) motor control loop has a position control section 60, a speed control section 61, a current control section 61, and PWM signal generating section 63. An SP (Serial/Parallel) conversion section 64 is used by two control loops. The upper control unit 10 applies a position target value Pref, a speed target value Sref, and a current target value Iref respectively to the position control section 60, the speed control section 61, and the current control section 62 through an higher board interface 73.

on the other hand, the encoder signals e1 through e6 are applied to the position control section 60, the speed control section 61, and the current control section 62 through the encoder connector 23. A current detection value Idet is applied through the SP conversion section 64 to the current control section 62.

The position control section 60 compares the aforementioned position target value Pref with a position detection value Pdet which is obtained from the encoder signal e1 by conversion, and outputs the difference between them, which is applied, as a speed instruction s to the speed control section 61.

In the latter 61, the speed instruction s is compared with a speed detection value Sdet which is obtained from the encoder signal e1 by conversion, to provide a difference between them, and forms a current instruction i according to the difference thus provided and to the speed target value Sref. The current instruction i is applied to the current control section 62. In the current control section 62, a current amplitude instruction value is obtained by addition of the current target value Iref and the current instruction i, and the current amplitude instruction value thus obtained is converted into a two-phase current instruction value according to a motor magnetic pole position obtained from the encoder e1, and forms a three-phase voltage instruction v according to a current detection value Idet, a gain correction data Cg and an off-set correction data Co which are from a correction section 71. The three-phase voltage instruction v is applied to the PWM signal generating section 63. The PWM signal generating section 63 forms a PWM (pulse width modulation) signal al according to the instruction v, and applies it to the biaxial inverter unit 6 through a control inverter I/F connector 37. The correction section 71 is detection error correcting means for a current detector 54 (described later). The means produces the gain correction data Cg, and the off-set correction data Co, on the basis of the parallel data which are obtained by converting the microcomputer serial signals c1 through c3 from microcomputers 57 with the aid of serial-parallel convertors 67, 68 and 69.

Figure 6:
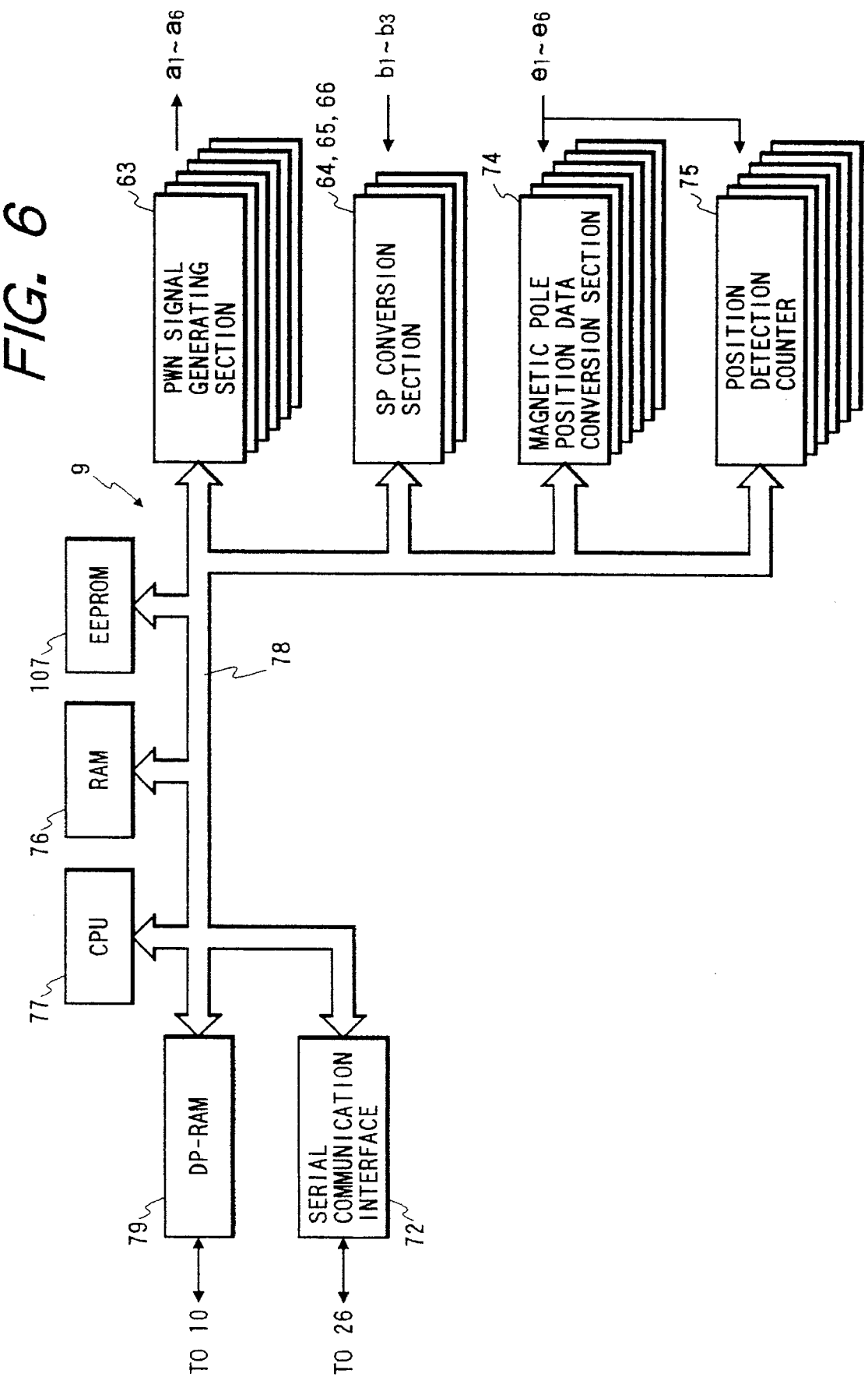
FIG. 6 is a block diagram showing an example of the arrangement of hardware in the lower control unit.

FIG. 6 shows an example of the arrangment of the lower control unit 9. The unit 9 comprisee: a CPU 66 for controlling the unit 9 as a whole; a RAM 76; an EEPROM (or flash memory) 107; a DP-RAM (or dual-port RAM) 79, the serial communication interface 72; the PWM signal generating sections 63; SP conversion sections 64 through 66; the magnetic pole position data conversion sections 74, and the position detection counters 75, all of which are connected to one another through buses 78. The DP-RAM 79 serves as a data buffer for transmission of data from and to the higher control unit.

Figure 7:
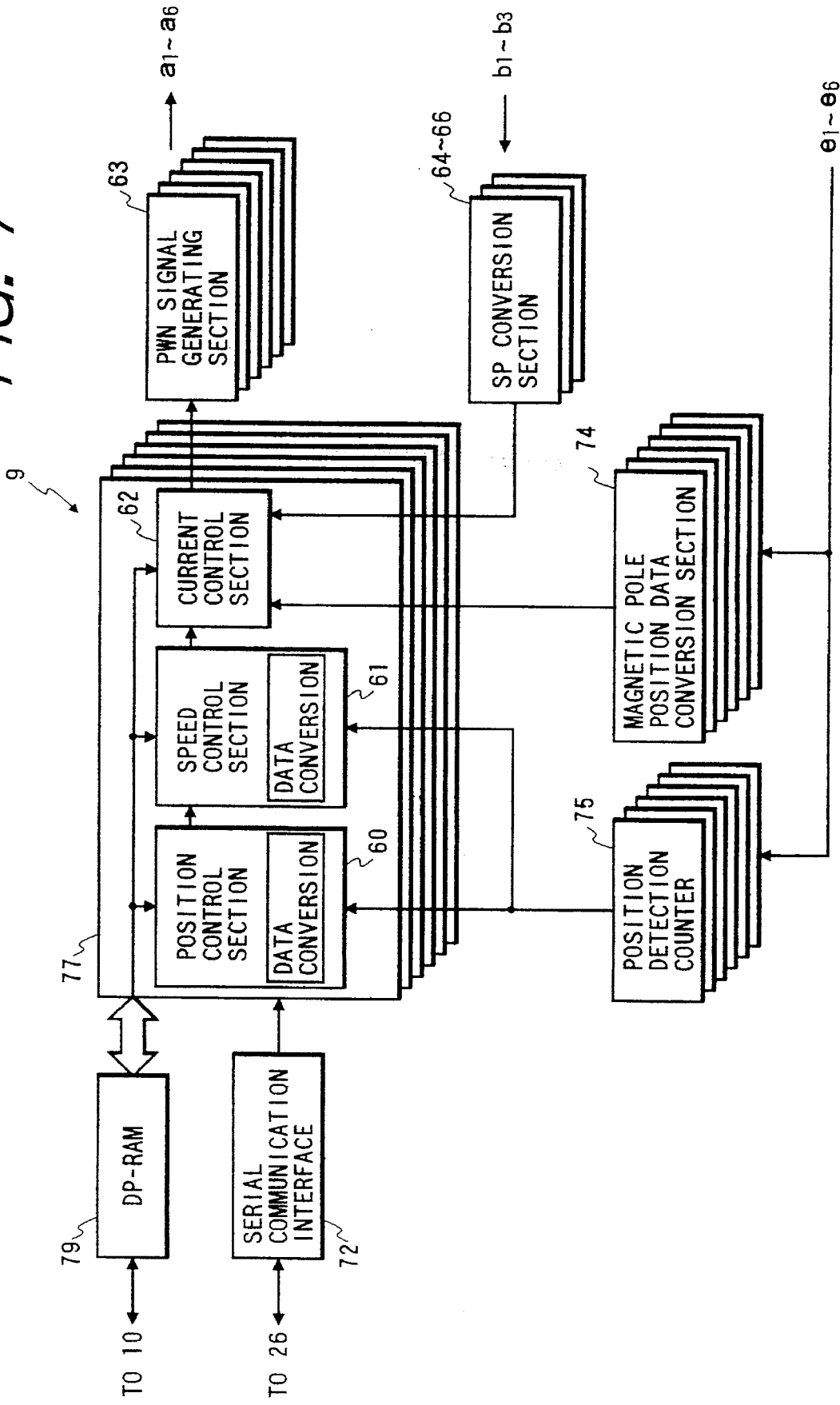
FIG. 7 is a block diagram showing an example of the operation performed by a CPU in the lower control unit.

FIG. 7 is a diagram for a description of the operations of the CPU 77 in the lower control unit 9. As shown in FIG. 7, the position control section 60, the speed control section 61, and the current control section 62 (which are all shown in FIG. 5), are all operated by the CPU 77 at high speed in time-sharing mode.

(IV) BIAXIAL INVERTER UNITS

As conducive to a full understanding of the invention, the biaxial inverter units 6, 7 and 8 will be described again with reference to FIG. 4. Those biaxial inverter units 6 through 8 are equal in structure to one another. Hence, for simplification in description, only the unit 6 will be described as a typical one.

The biaxial inverter unit 6 includes inserters for two servomotors M1 and M2. In the embodiment, the unit 6 is for two axes; however, the invention is not limited thereto or thereby; that is, in general, it may be designed for n (plural) axes. The reason why one inverter unit includes a plurality of inserters is to simplify the circuitry and to reduce the manufacturing cost.

As shown in FIG. 4, the output PWM signal al of the lower control unit 9 is applied to a dead time forming section 51. The section 51 is provided for the following purpose: When, in the inverter adapted to convert DC power into three-phase AC power, a pair of power transistors connected in direct to one phase therein are rendered conductive (on) at the same time, a through current may flow. In order to prevent the through-current, the dead time forming section 51 is provided. The output of the dead time forming section 51 is applied to the inverter 52.

As was described above, the inverter 52 is a power inverter for converting DC power into three-phase AC power, and it is generally formed by connecting power transistors in a three-phase bridge form. The three-phase AC power outputted by the inverter 52 is applied through the inverter large current connector 38 and the power line connector 13 and through the motor wire 16 (FIG. 1) to the motor M1. Similarly, a PWM signal a2 from the lower control unit 9 is applied to a dead time forming section 55, and the output of the latter 55 is applied to the inverter 56. The three-phase AC power outputted by the inverter 56 is applied through the inverter large current connector 38 and the power line connector 13 and the motor wire 17 (FIG. 1) to the servomotor M2.

Now, a drive current detection feedback loop in the biaxial inverter unit 6 will be described. The feedback loop may be outlined as follows; Two of the three-phase outputs of the inverter 52, and two of the three-phase outputs of the inverter 56 are connected to a current detector 54, so that the output drive currents of the inserters 52 and 56 are monitored. The current detector 54, provided for both of the inserters 52 and 56, is to detect the current values of AC powers supplied to the inserters 52 and 56. The current detection gain of the current detector 54 can be changed with a switch signal from the microcomputer 57. The current detection value of the current detector 544 is converted into a digital signal by an A/D (analog-to-digital) converter 53 of multi-channel input and serial output type, which is applied to the SP conversion section 64 of the lower control unit 9. The above-described 54, A/D converter 53, and SP conversion section 64 form a feedback loop for the inserters 52 and 56.

(V) CURRENT DETECTOR

Figure 8:
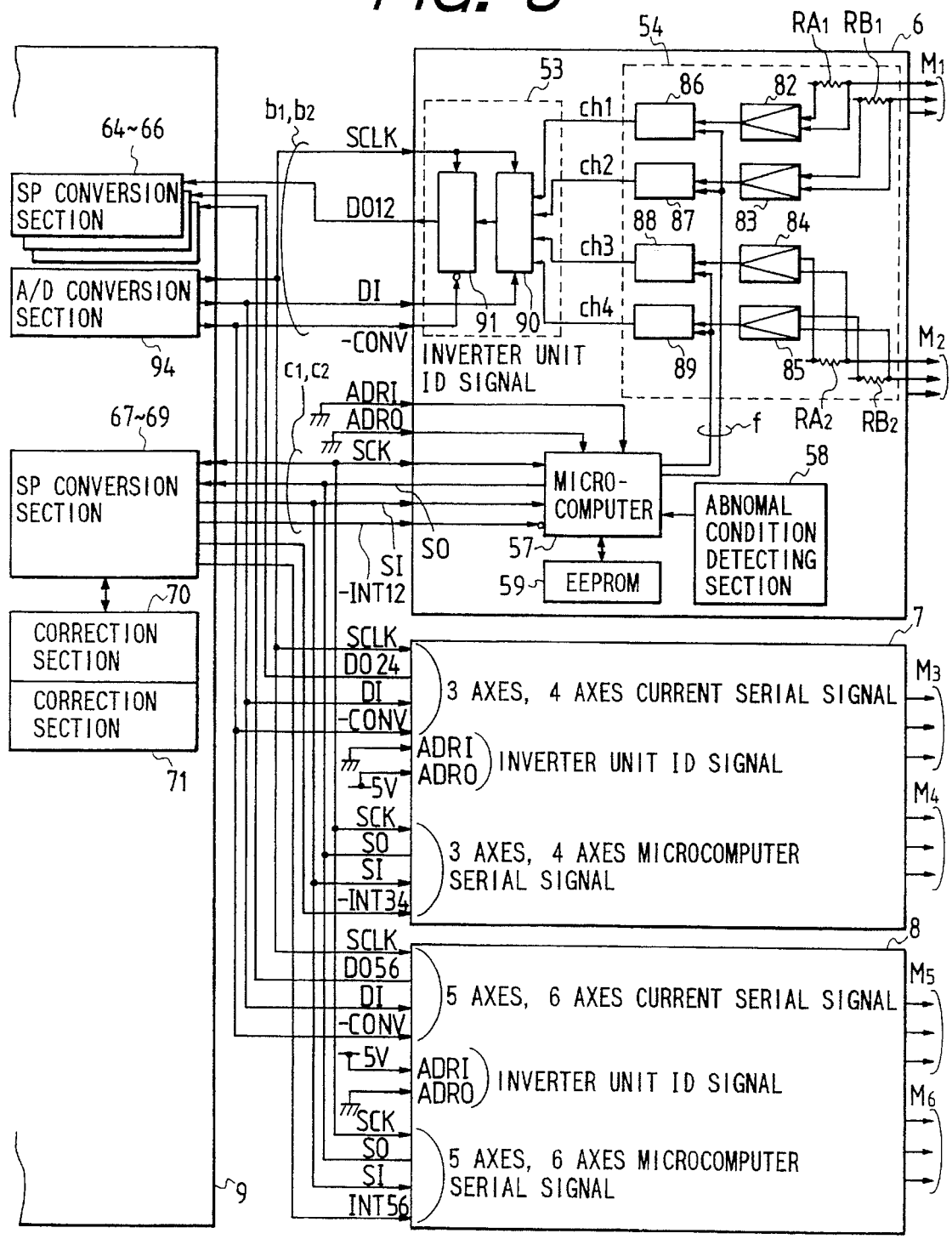
FIG. 8 is a block diagram showing circuits pertaining to current detectors in a biaxiel inverter units.

FIG. 8 is a circuit diagram, partly as a block diagram, showing the A/D converter 53 and the current detector 54 in the biaxial inverter unit 6, and their connection to the lower control unit 9. As shown in FIG. 8, current detecting resistors RA1 and RB1 are connected in the output wires of the inverter 52. The voltage across the current detecting resistor PA1 is applied, as a drive current detection signal of a first phase ("A" phase) of the inverter 52, to an insulating amplifier 82; while the voltage across the current detecting resistor RB1 is applied, as a drive current detection signal of a second phase ("B" phase) of the inverter 52, to another insulating amplifier 83. Similarly, current detecting resistors PA2 and RB2 are connected in the output wires of the inverter 56. The voltage across the current detecting resistor RA2 is applied, as a drive current detection signal of a first phase ("A" phase) of the inverter 56, to an insulating amplifier 84; while the voltage across the current detecting resistor RB2 is applied, as a drive current detection signal of a second phase ("B" phase) of the inverter 56, to an insulating amplifier 85.

The insulating amplifiers 82 through 85 are to electrically insulate the output wires of the great power system inserters 52 and 56 from the feedback loop small signal system. Those insulating amplifiers 82 through 85 are of electro-optical/or opto-electrical conversion, or electro-magnetic/or magneto-electrical conversion. The output signals of the insulating amplifiers 82 through 85 are applied to variable gain amplifiers 86 through 89.

The variable gain amplifiers 86 through 89 are made up of operational amplifiers so that they are operable even in the case where the operating specification is changed—for instance when the servomotors M1 through M6 different in rating (for instance, 5A and 10A motors) are used. That is, when, in the prior art (FIG. 12), the servomotors M1 through M6 are changed with ones different in rating, it is necessary to replace the motor control devices U1 through U6 in accordance with the ratings of the new servomotors M1 through M6, and in addition it is necessary to connect the cables 201, 209 and 210 all over again. However, in the embodiment of the invention, the additional capacitor units 3 and 4 (cf. FIGS. 1 and 4) are detachably installed, and the variable gain amplifiers 86 through 89 are employed. This feature makes it unnecessary to modify the motor control system even when the servomotors are changed.

Figure 9:
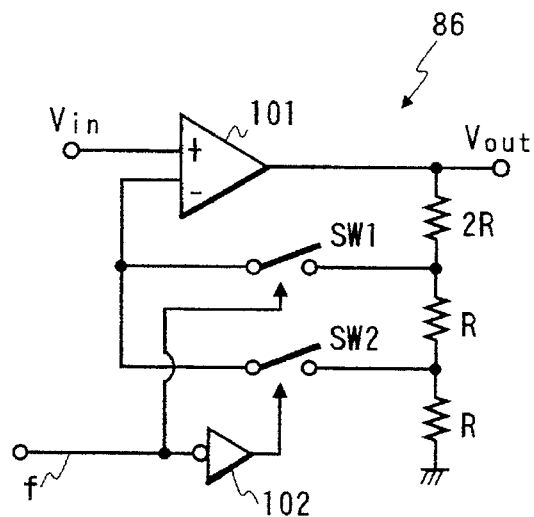
FIG. 9 is a circuit diagram, partly as a block diagram, showing an example of a variable gain amplifier in the biaxial inverter unit.
Figure 10:
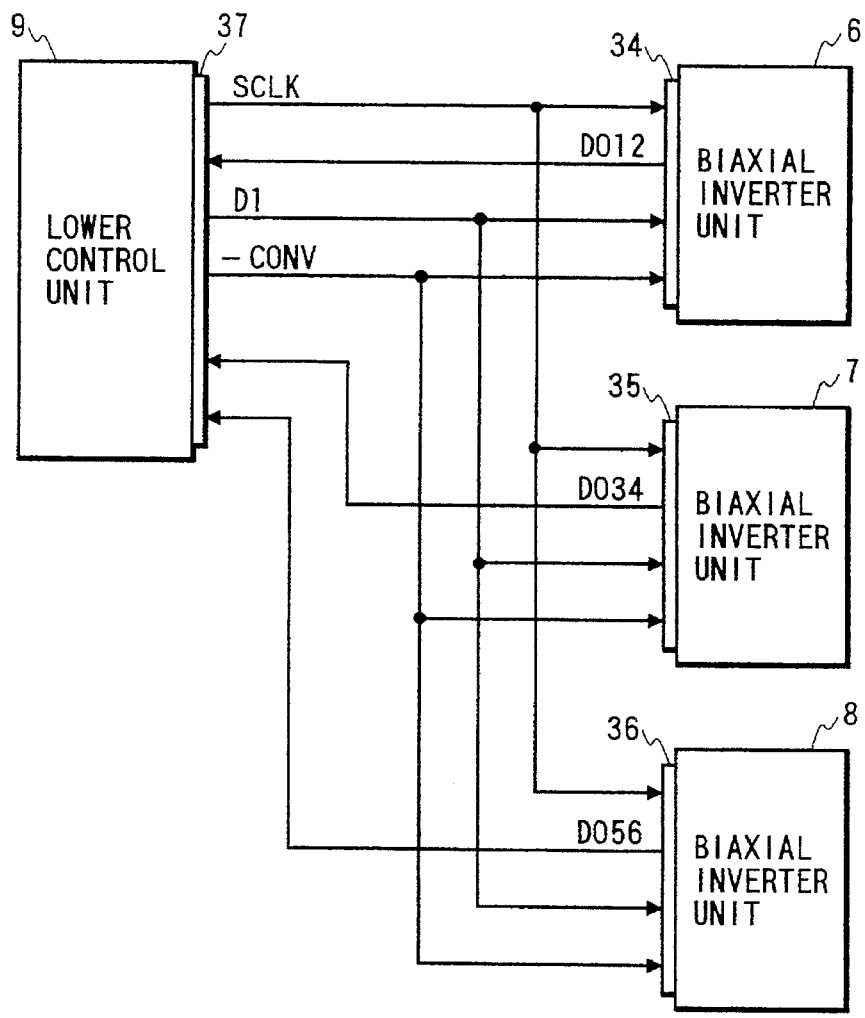
FIG. 10 is a block diagram showing the wiring of the lower control unit to the biaxial inverter units.

FIG. 9 shows an example of the variable gain amplifier 86 (the remaining variable gain amplifiers 87 through 89 being equal to the amplifier 86). As shown in FIG. 9, the variable gain amplifier 86 is so designed that the gain; i.e., the degree of amplification of an operational amplifier 101 is adjusted by changing the feedback resistance (2R, R and R) of the operational amplifier with switches SW1 and SW2. Those switches SW1 and SW2 may be analog switches which may be operated with a gain switching signal f from the microcomputer 57. In the circuit shown in FIG. 9, the gain is switched in two steps; however, it goes without saying that it can be switched in more than two steps. When the gain switch signal is at a logic level "1", the switch SW1 is turned on; and when it is a logic level "0", the switch SW2 is turned on.

(VI) A/D CONVERTER

As shown in FIG. 8, the A/D converter 53 is made up of an A/D converter of 4-channel input and serial output type, and is used for the inserters 52 and 56. As shown in FIG. 8, the AD converter 53 comprises an input switch section 90 and an A/D conversion section 91. The input switch section 90 is a selector to selectively transmit four-channel current detection value signals to the A/D conversion section 91. That is, it applies one of the four-channel current detection value signals to the A/D conversion signal 91 in synchronization with a clock signal SCLK in response to an instruction signal DI from the A/D conversion control section 94. The A/D conversion section 91 converts the current detection value signal into a digital signal in synchronization with the clock signal SCLK in response to a strobe signal –CONV from the A/D conversion control section 94. The current detection value signal DO12 thus converted is applied to the SP conversion section 64 of the lower control unit 9. The serial current detection value signal DO12 is to transmit a first axis current detection value and a second axis current detection value in a time-sharing mode; that is, it is not for transmit the two current values simultaneously.

Figures 11, 12:
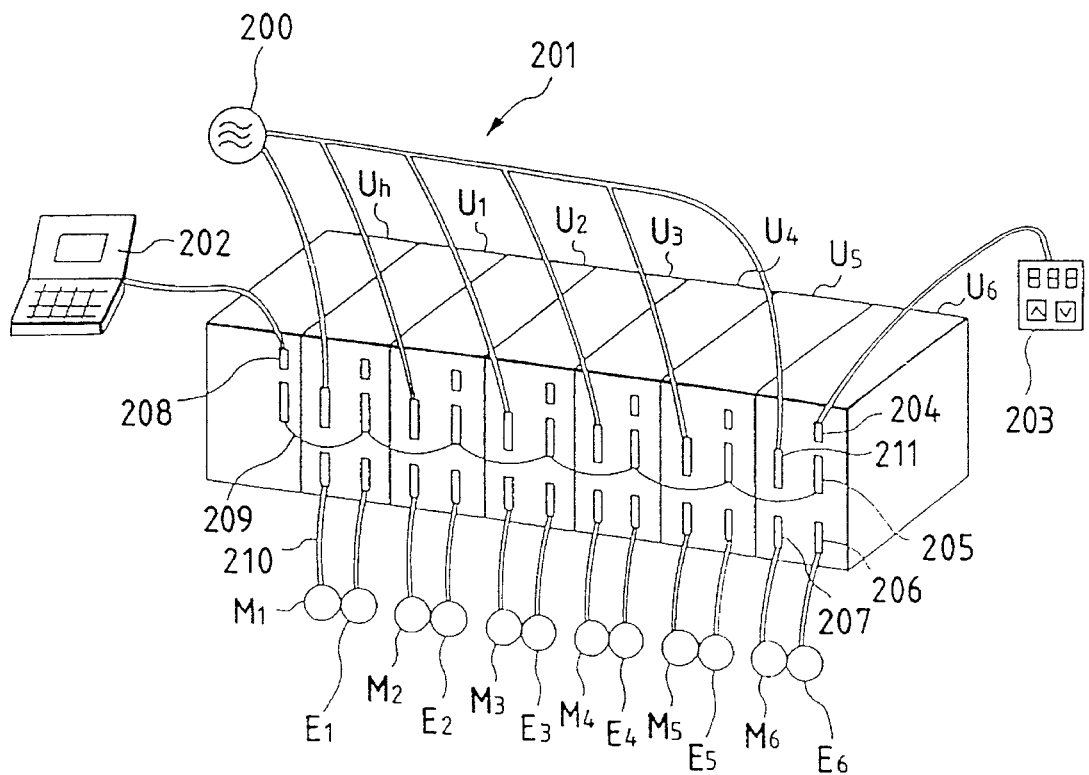
FIG. 11 is an explanatory diagram showing the comparison between the prior art and the present invention in the number of connector signal pins between the lower control unit and the biaxial inverter units.
FIG. 12 is an external perspective view showing an example of the arrangement of a conventional motor control system.
Figure 13:
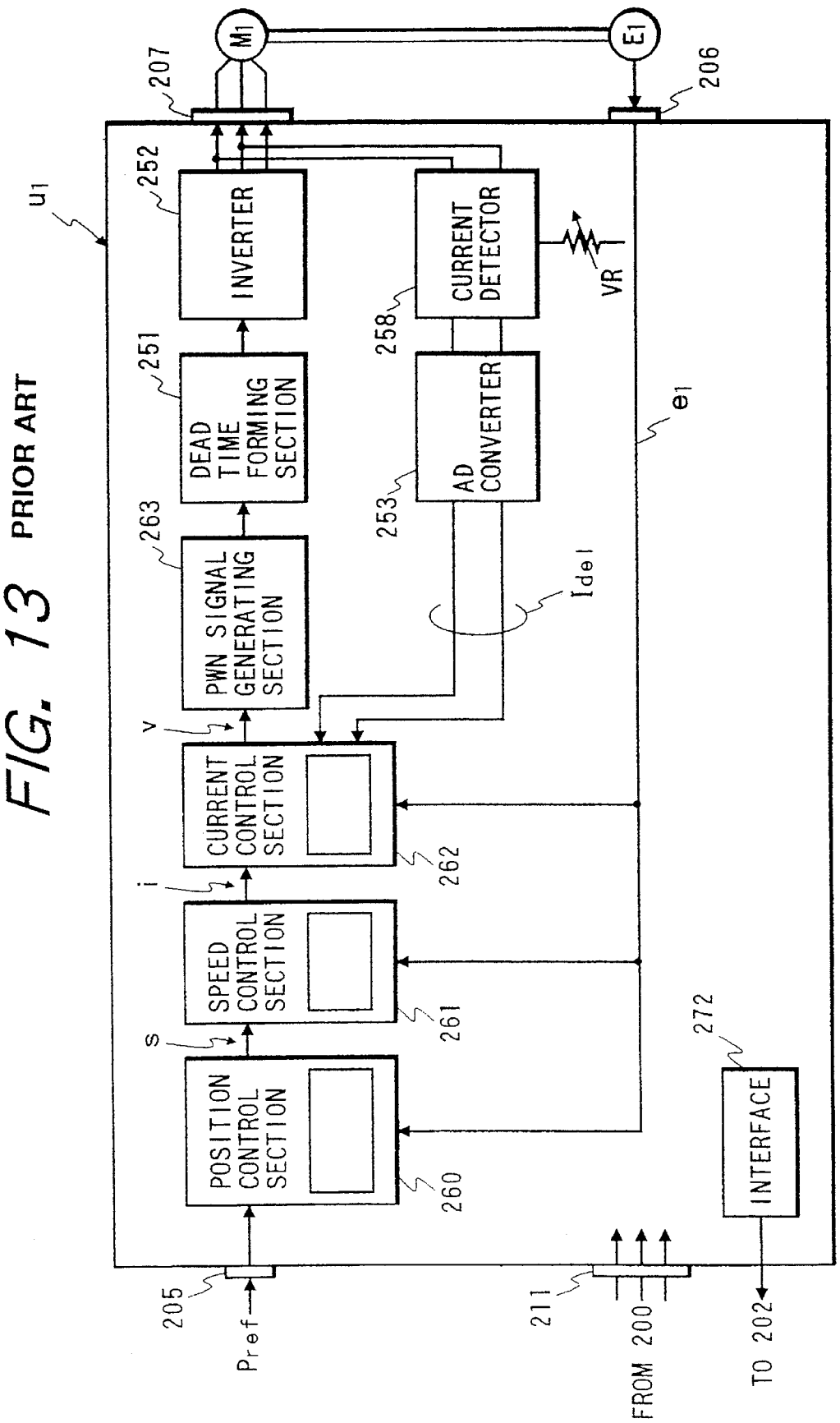
FIG. 13 is a block diagram showing an example of the arrangement of a control unit per axis in the conventional motor control system.

As was described above, for A/D conversion of biaxial current detection values, the A/D converter 53 of four-channel input and serial output type is employed, and yet it is for double axis. Hence, as shown in FIG. 11, as for six axes, the number of signal lines can be reduced to six (6), and accordingly the number of pins is decreased to six (6). That is, the number of signal lines is reduced, the connectors can be miniaturized, and the biaxial inverter unit 6 itself can be miniaturized.

The differences in the number of signal pins between the prior art and the embodiment of the invention are as indicated in FIG. 11. In the prior art, each inverter employs the A/D converter of 2-channel-input and 12-bit-parallel-output type. That is, in the prior art, as for the six axes in total, at least nineteen (19) signal lines must be connected to the lower control unit 9 {which is the sum of 12 (A/D converter output lines)+1 (channel switch signal line)+6 (A/D converter selecting signal lines)}, and accordingly nineteen (19) signal pins must be provided in correspondence to the number of signal lines. On the other hand, the motor control system of the invention is markedly simplified in construction as is seen from FIG. 11.

As was described above, in the motor control system of the invention, the predetermined wiring circuit has been formed on the circuit board. Hence, when the functional element units are fixedly mounted on the circuit board, the unit-side connectors are engaged with the base-board-side connectors, so that the functional element units are electrically connected to one another, with the result that the wiring work can be achieved with ease, and the disused connectors can be disposed of; that is, the number of connectors used therein is reduced as much. In addition, the functional element units are electrically connected through those connectors as was described above. This feature provides the following effects: the wiring is reasonable and orderly, the number of wires is reduced, the occurrence of wiring errors is prevented, and in addition the application of external noises to the wires is prevented. That is, the operation of the motor control system of the invention is high in reliability.

What is claimed is:

1. A motor control system comprising:

main circuit power source means for converting AC power supplied from a power source into DC power;

motor drive means for converting said DC power into AC power, and supplying said AC power thus converted to a plurality of servomotors;

control means for controlling the operation of said motor drive means:

functional element units provided in such a manner that said main circuit power means, said motor drive means, and said control means are separated from one another, and accommodated, as units, in respective casings, said functional element units having electrically wiring unit-side connectors; and a circuit board provided on which a predetermined wiring circuit has been formed, and having electrical wiring base-board-side connectors which are connected to said unit-side connectors, wherein when said functional element units are fixedly mounted on said circuit board as required, said unit-side connectors are engaged with said bess-board-side connectors, so that said means are electrically connected to one another through said circuit board.

2. A motor control system as claimed in claim 1, wherein an inverter unit which accommodates said motor drive means includes:

a plurality of current detecting means for detecting current values of AC power supplied individually to said plurality of servomotors; and an A/D converter for converting output signals of said current detecting means into digital signals, wherein said A/D converter being multi-channel input and serial output type, in which output signals of said plurality of current detecting means are selectively subjected to A/D conversion.

3. A motor control system as claimed in claim 1, wherein said circuit board has a power connector to which AC power supplied from said power source is applied, and said AC power being supplied through said wiring circuit formed on said circuit board to a main circuit power unit in which said main circuit power source means which is a high voltage power source is accommodated, and to a small signal power source unit which is a low voltage power source.

4. A motor control system as claimed in claim 3, wherein DC power from said main circuit power unit is supplied through said wiring circuit formed on said circuit board to an inverter unit in which said motor drive means is accommodated, and power from said small signal power unit is supplied through said wiring circuit formed on said circuit board to said inverter unit.

5. A motor control system as claimed in claim 4, wherein said control means for controlling the operation of said motor drive means includes:

a higher control unit which receives an external control signal applied thereto from outside; and a lower control unit which receives said external control signal from said higher control unit, and controls a plurality of said inverter units;

wherein power from said small signal power unit is supplied through said wiring circuit formed on said circuit board to said higher control unit and said lower control unit.

6. A motor control system as claimed in claim 5, wherein said plurality of inverter units are each connected to two servomotors, and each of said servomotors thus connected to said inverter units has a rotation detecting encoder, and encoder signals from said rotation detecting encoders are applied to encoder connectors provided on said lower control unit.

7. A motor control system comprising:

main circuit power source means for converting AC power supplied from a power source into DC power;

motor drive means for converting said DC power into AC power, and supplying said AC power thus converted to a plurality of servomotors, said motor drive means being in correspondence in number to said servomotor;

control means for controlling the operation of said motor drive means, functional element units which are classified into a main circuit power unit including said main circuit power means, motor driving inverter units which includes said motor drive means, and which are accommodated in one and the same casing for every at least two of said plurality of servomotors, and a control unit for generally controlling said motor drive means, said units being accommodated in respective casings, and having electrical wiring unit-side connectors; and a circuit board on which a wiring circuit required for connecting said units to one another have been formed, and which has base-board side connectors which are engageable with said unit-side connectors, wherein when said functional element units being fixedly mounted on said circuit board as required, said unit-side connectors are engaged with said base-board side connectors, so that said functional element units are electrically connected to one another through said circuit board, thus forming said motor control system.

8. A motor control system as claimed in claim 7, wherein said functional element units further include, as an additional unit, at least one of the following units: an additional capacitor unit which is connectable with output stage of said main circuit power means; a small signal power unit for supplying small signal power to said control unit and said inverter units, and a higher control unit for transmitting an external control instruction signal to said control unit, and wherein said circuit board has a wiring circuit required for wiring said additional unit, and has electrical wiring base-board-side connectors which are engageable with said unit-side connectors.

9. A motor control device as claimed in claim 7, said functional element units further includes: an additional capacitor unit which is connectable with output stage of said main circuit power means; a small signal power unit for supplying small signal power to said control unit and said inverter units, and a higher control unit for transmitting an external control instruction signal to said control unit, and wherein said circuit board has a wiring circuit required for wiring said additional unit, and has electrical wiring base-board side connectors which are engageable with said unit-side connectors.

10. A motor control system as claimed in claim 9, said functional element units are classified into a large power system group and a small signal system group, and are fixedly arranged on said circuit board in such a manner as to be spaced from one another, said large power system group having said main circuit power unit, additional capacitor unit and small signal power unit, and said small signal system group having said plurality of inverter units, control unit and higher control unit.

11. A motor control system as claimed in claim 7, further comprising:

one of heat generating bodies and cooling fin assemblies which are mounted on said units is provided on the side which is opposite to the side where said electrically wiring unit-side connectors are provided.

* * * * *